(12) United States Patent
Yamazaki

(10) Patent No.: US 8,525,606 B2
(45) Date of Patent: Sep. 3, 2013

(54) VIBRATOR ELEMENT, VIBRATOR, OSCILLATOR, AND ELECTRONIC DEVICE

(75) Inventor: Takashi Yamazaki, Shiojiri (JP)

(73) Assignee: Seiko Epson Corporation (JP)

( * ) Notice: Subject to any disclaimer, the term of this patent is extended or adjusted under 35 U.S.C. 154(b) by 30 days.

(21) Appl. No.: 13/363,483

(22) Filed: Feb. 1, 2012

(65) Prior Publication Data

US 2012/0194285 A1    Aug. 2, 2012

(30) Foreign Application Priority Data

Feb. 2, 2011   (JP) ................. 2011-020414

(51) Int. Cl.
*H01L 41/053* (2006.01)
*H03B 5/32* (2006.01)
*H03H 9/24* (2006.01)

(52) U.S. Cl.
USPC ............................ 331/156; 333/200; 310/370

(58) Field of Classification Search
USPC ............... 331/156, 158; 333/200; 310/370, 310/344; 29/25.35
See application file for complete search history.

(56) References Cited

U.S. PATENT DOCUMENTS

| | | |
|---|---|---|
| 2002/0089386 A1 | 7/2002 | Kitamura et al. |
| 2002/0113527 A1 | 8/2002 | Kawashima |
| 2008/0105052 A1 | 5/2008 | Takahashi et al. |
| 2009/0178260 A1 | 7/2009 | Yamazaki et al. |
| 2009/0206704 A1 | 8/2009 | Kitamura |
| 2010/0201223 A1 | 8/2010 | Ishii et al. |
| 2010/0244973 A1 | 9/2010 | Furuhata et al. |
| 2010/0244989 A1 | 9/2010 | Furuhata et al. |
| 2010/0320875 A1 | 12/2010 | Takizawa |
| 2011/0057549 A1 | 3/2011 | Kawai et al. |
| 2011/0080070 A1 | 4/2011 | Furuhata et al. |
| 2011/0156826 A1 | 6/2011 | Kawai |
| 2011/0156827 A1 | 6/2011 | Kawai |
| 2011/0187470 A1 | 8/2011 | Yamada |

FOREIGN PATENT DOCUMENTS

| | | |
|---|---|---|
| JP | 02-032229 | 2/1990 |
| JP | 2001-196891 | 7/2001 |
| JP | 2002-204141 | 7/2002 |
| JP | 2002-261575 | 9/2002 |
| JP | 2004-260249 | 9/2004 |
| JP | 2005-151423 | 6/2005 |
| JP | 2005-318365 | 11/2005 |
| JP | 2005-331485 | 12/2005 |
| JP | 2008-011348 | 1/2008 |
| JP | 2008-096138 | 4/2008 |
| JP | 2008-224628 | 9/2008 |
| JP | 2008-224630 | 9/2008 |
| JP | 2009-005022 | 1/2009 |
| JP | 2009-005023 | 1/2009 |
| JP | 2009-005024 | 1/2009 |
| JP | 2009-118217 | 5/2009 |
| JP | 2009-171118 | 7/2009 |
| JP | 2009-200706 | 9/2009 |
| JP | 2009-239860 | 10/2009 |
| JP | 2010-028535 | 2/2010 |
| JP | 2010-028536 | 2/2010 |
| JP | 2010-103805 | 5/2010 |
| JP | 2010-187059 | 8/2010 |
| JP | 2010-187195 | 8/2010 |
| JP | 2010-187196 | 8/2010 |
| JP | 2010-187197 | 8/2010 |
| JP | 2010-193331 | 9/2010 |
| JP | 2010-226608 | 10/2010 |
| JP | 2010-226609 | 10/2010 |
| JP | 2010-252302 | 11/2010 |
| JP | 2010-252303 | 11/2010 |
| JP | 2011-004035 | 1/2011 |
| JP | 2011-082782 | 4/2011 |
| JP | 2011-082945 | 4/2011 |
| JP | 2011-087154 | 4/2011 |
| JP | 2011-097562 | 5/2011 |
| JP | 2011-155628 | 8/2011 |
| JP | 2011-155629 | 8/2011 |
| JP | 2011-160250 | 8/2011 |
| JP | 2011-191091 | 9/2011 |
| JP | 2011-199453 | 10/2011 |
| JP | 2011-199454 | 10/2011 |
| JP | 2011-199661 | 10/2011 |
| JP | 2011-223371 | 11/2011 |
| JP | 2011-223435 | 11/2011 |
| JP | 2011-223489 | 11/2011 |
| JP | 2011-228922 | 11/2011 |
| JP | 2011-228980 | 11/2011 |
| JP | 2011-232264 | 11/2011 |
| JP | 2011-234072 | 11/2011 |
| WO | 00-44092 | 7/2000 |

OTHER PUBLICATIONS

Roszhart, T.V., "The Effect of Thermoelastic Internal Friction on the Q of Micromachined Silicon Resonators", Solid-State Sensor and Actuator Workshop, 4th Technical Digest, IEEE, Kearfott Guidance and Navigation Corporation, Little Falls, NJ, (Jun. 1990), pp. 13-16.

*Primary Examiner* — Joseph Chang

(74) *Attorney, Agent, or Firm* — Harness, Dickey & Pierce, P.L.C.

(57) ABSTRACT

A vibrator element includes: a base portion; and three vibrating arms that extend from the base portion in the Y axis direction. The vibrating arms are arranged in the X axis direction, include excitation electrodes on a principal face, and vibrate in the Z axis direction. When an arm width of the vibrating arm, which is located at the center of the arrangement, in the X axis direction is W1, each arm width of the other vibrating arms in the X axis direction is W, an electrode width of the excitation electrode of the vibrating arm, which is located at the center of the arrangement, in the X axis direction is A1, and each electrode width of the excitation electrodes of the other vibrating arms in the X axis direction is A, $1.35 < W1/W < 1.90$ and $1.35 < A1/A < 1.90$.

18 Claims, 6 Drawing Sheets

VIBRATOR ELEMENT, VIBRATOR, OSCILLATOR, AND ELECTRONIC DEVICE

BACKGROUND

1. Technical Field

The present invention relates to a vibrator element and a vibrator, an oscillator, and an electronic device that include the vibrator element.

2. Related Art

Generally, as a vibrator element, a tuning fork type-vibrator (hereinafter, referred to as a vibrator element) is known which has a first face arranged toward a first direction, three arms (hereinafter referred to as vibrating arms) arranged in a second direction intersecting the first direction, piezoelectric elements (excitation electrodes) each one disposed on the first face of each vibrating arm, a base portion that connects one ends of the vibrating arms (for example, see JP-A-2009-5022).

Recently, in accordance with the progress in the miniaturization of the vibrator element, there is a problem in that the Q value (a dimensionless number representing the vibration state, and the higher this value is, the more stable the vibration is) decreases.

A vibrator element disclosed in JP-A-2009-5022 is configured such that the vibrating arms have a vibration form (out-of-plane vibration mode) of flexural vibration in a direction perpendicular to the first face and achieves suppression of the decrease in the Q value (in other words, the improvement of the Q value) by configuring the vibrating direction of a center vibrating arm and the vibrating direction of the vibrating arms located on both sides to be opposite directions (inverse phases) and balancing the vibration of both parties.

However, in the embodiment of the vibrator element, since the arm widths of the three vibrating arms are formed to be the same, in a case where the vibration amplitudes of the three vibrating arms are the same, based on the principle of conservation of momentum and the like, there is a concern that the vibration of the center vibrating arm and the vibration of the vibrating arms located on both sides may not be sufficiently balanced.

Accordingly, in the vibrator element, since the vibration energy of the vibrating arms can be easily delivered to the base portion, there is a concern that the Q value may decrease due to the leakage of the vibration energy into an external member through the base portion.

SUMMARY

An advantage of some aspects of the invention is to solve at least a part of the problems described above, and the invention can be implemented as the following forms or application examples.

Application Example 1

This application example is directed to a vibrator element including: a base portion; and at least three vibrating arms that extend from the base portion in a first direction. The vibrating arms are arranged in a second direction perpendicular to the first direction, and each one of the vibrating arms includes an excitation electrode at least on one principal face extending along a plane that is specified by the first direction and the second direction, and each one of the vibrating arms is vibrated by the excitation electrode in a third direction perpendicular to the principal face. In addition, when the vibrating arm located at the center of the arrangement out of the vibrating arms is set as a first vibrating arm, and each one of the vibrating arms located on both ends of the arrangement is set as a second vibrating arm, the first vibrating arm and the second vibrating arm vibrate in opposite directions, and, when an arm width of the first vibrating arm in the second direction is W1, an arm width of the second vibrating arm in the second direction is W, an electrode width of the excitation electrode of the first vibrating arm in the second direction is A1, and an electrode width of the excitation electrode of the second vibrating arm in the second direction is A, $1.35<W1/W<1.90$ and $1.35<A1/A<1.90$.

According to the above-described vibrator element, when the arm width of the first vibrating arm in the second direction is W1, the arm width of the second vibrating arm in the second direction is W, the electrode width of the excitation electrode of the first vibrating arm in the second direction is A1, and the electrode width of the excitation electrode of the second vibrating arm in the second direction is A, the vibrator element satisfies the relationship "$1.35<W1/W<1.90$ and $1.35<A1/A<1.90$". Accordingly, the mechanical balance between the vibration of the first vibrating arm and the vibration of the second vibrating arms in the third direction can be sufficiently secured.

Therefore, in the vibrator element, it is difficult for the vibration energy of the vibrating arms to be delivered to the base portion, and the vibration energy leaking to an external member through the base portion decreases so as to suppress a decrease in the Q value, whereby the Q value can be maintained at a predetermined level (in other words, the Q value can be improved more than that of a general configuration).

In addition, the above-described range is set by the inventors or the like based on findings acquired through analysis results of simulations and experiments, and the like.

Application Example 2

In the vibrator element according to the application example described above, it is preferred that the excitation electrode includes: a first electrode that is disposed on the principal face side; a second electrode that is disposed so as to face the first electrode; and a piezoelectric body that extends between the first electrode and the second electrode.

According to the above-described vibrator element, since the excitation electrode includes: a first electrode; a second electrode that is disposed so as to face the first electrode; and a piezoelectric body that extends between both the electrodes, the vibrating arms can be vibrated in accordance with the expansion/contraction of the excitation electrode.

Thus, since a piezoelectric material does not need to be necessarily used for the base member (a material that is a base of the configuration) of the vibrator element, there is a broad range of options for the base member, and accordingly, for example, a semiconductor material such as silicon can be used for the base member.

Application Example 3

In the vibrator element according to Application Example 2, it is preferred that, when viewed from the third direction, a width in which the first electrode, the second electrode, and the piezoelectric body of the first vibrating arm overlap one another is A1', a width in which the first electrode, the second electrode, and the piezoelectric body of the second vibrating arm overlap one another is A', $1.35<A1'/A'<1.90$.

According to the above-described vibrator element, when the above-described width of the excitation electrode of the first vibrating arm is A1', and the above-described width of the excitation electrode of the second vibrating arm is A', the vibrator element satisfies the relationship 1.35<A1'/A'<1.90. Therefore, the vibration of the vibrating arms according to the expansion/contraction of the piezoelectric bodies of the excitation electrodes is sufficiently balanced, whereby the decrease in the Q value can be suppressed further.

Application Example 4

In the vibrator element according to the application example described above, it is preferred that a thickness of the base portion in the third direction is larger than a thickness of each one of the vibrating arms in the third direction.

According to the above-described vibrator element, in the vibrator element, since the thickness of the base portion in the third direction is larger than the thickness of each vibrating arm in the third direction, a difference between the weight of the base portion and the weight of the vibrating arms increases due to an increase in the weight of the base portion, whereby it is difficult for the vibration energy of the vibrating arms to be delivered to the base portion.

Therefore, in the vibrator element, the vibration energy leaking to an external member through the base portion decreases further so as to further suppress a decrease in the Q value, whereby the Q value can be maintained at a predetermined level.

Application Example 5

In the vibrator element according to the application example described above, it is preferred that fixed portions are disposed in both end portions of the base portion in the second direction.

According to the above-described vibrator element, in the vibrator element, the fixed portions are disposed in both end portions of the base portion in the second direction, whereby it is possible to lengthen a path from the vibrating arm to the fixed portions of the base portion.

As a result, in the vibrator element, the vibration energy leaking to an external member through the fixed portions when the fixed portions of the base portion are fixed to the external member decreases further so as to further suppress the decrease in the Q value, whereby the Q value can be maintained at a predetermined level.

Application Example 6

In the vibrator element according to the application example described above, it is preferred that a ratio W1/W of the arm width W1 to the arm width W is 1.60.

According to the above-described vibrator element, since the vibrator element satisfies the relationship W1/W=1.60, the mechanical balance between the vibration of the first vibrating arm and the vibration of the second vibrating arms in the third direction can be secured in an optimal state.

Therefore, in the vibrator element, it is difficult for the vibration energy of the vibrating arms to be delivered to the base portion, and the vibration energy leaking to an external member through the base portion decreases the most so as to suppress a decrease in the Q value the most, whereby the Q value can be maintained at a predetermined level.

In addition, the above-described values are set by the inventors or the like based on findings acquired through analysis results of simulations and experiments, and the like.

Application Example 7

This application example is directed to a vibrator that includes: the vibrator element according to the application example described above, and a package that houses the vibrator element.

According to the above-described vibrator, since the vibrator includes the vibrator element according to the application example described above and a package that houses the vibrator element, the vibrator having the advantages described in the application example described above can be provided.

Application Example 8

This application example is directed to an oscillator that includes: the vibrator element according to the application examples described above, and an oscillation circuit that oscillates the vibrator element.

According to the above-described oscillator, since the oscillator includes the vibrator element according to the application example described above, and an oscillation circuit that oscillates the vibrator element, the oscillator having the advantages described in the application example described above can be provided.

Application Example 9

This application example is directed to an electronic device including: the vibrator element according to the application example described above.

According to the above-described electronic device, since the electronic device includes the vibrator element according to the application example described above, the electronic device having the advantages described in the application example described above can be provided.

BRIEF DESCRIPTION OF THE DRAWINGS

The invention will be described with reference to the accompanying drawings, wherein like numbers reference like elements.

FIG. 1A is a plan view, and FIG. 1B is a cross-sectional view taken along line B-B shown in FIG. 1A.

FIG. 3A is a graph showing the relationship between a frequency change amount relating to the Q value and "arm width of center vibrating arm/arm width of vibrating arms located on both ends", and FIG. 3B is a graph showing the relationship between the frequency change amount and "electrode width of the excitation electrode of the center vibrating arm/electrode width of the excitation electrodes of the vibrating arms located on both ends.

FIG. 4A is a plan view viewed above the lid (lid body) side, and FIG. 4B is a cross-sectional view taken along line D-D shown in FIG. 4A.

FIG. 5A is a plan view viewed above the lid side, and FIG. 5B is a cross-sectional view taken along line D-D shown in FIG. 5A.

DESCRIPTION OF EXEMPLARY EMBODIMENTS

Hereinafter, embodiments of the invention will be described with reference to the drawings.

First Embodiment

Here, as an example of a vibrator element, a quartz crystal vibrator element will be described in which quartz crystal is used in a base member.

Figure 1A:
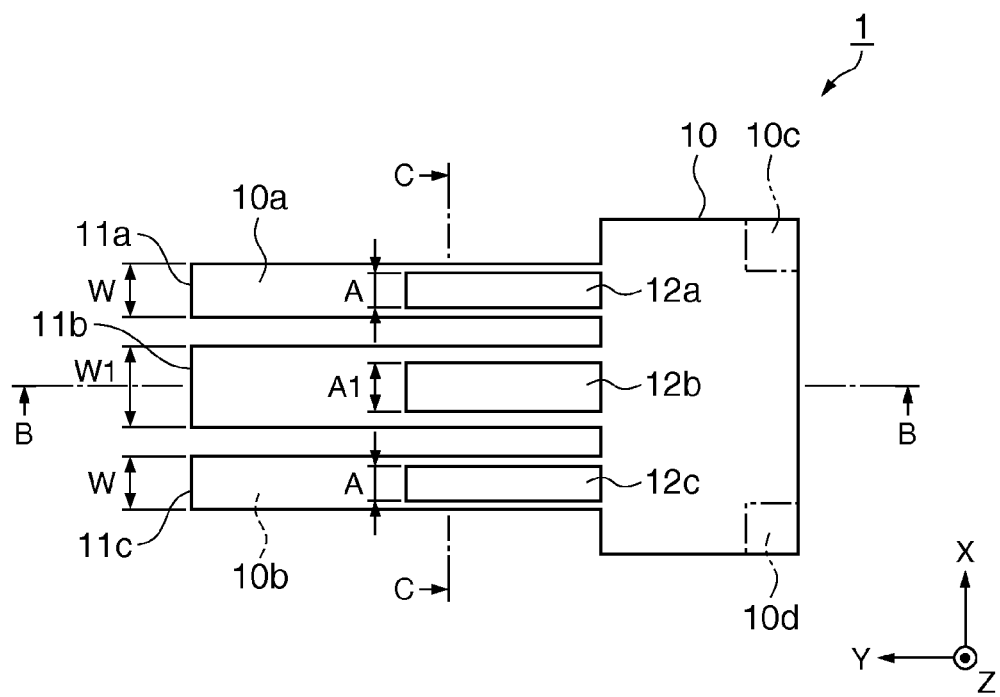
FIGS. 1A and 1B are schematic diagrams showing the schematic configuration of a quartz crystal vibrator element according to a first embodiment.
Figure 1B:
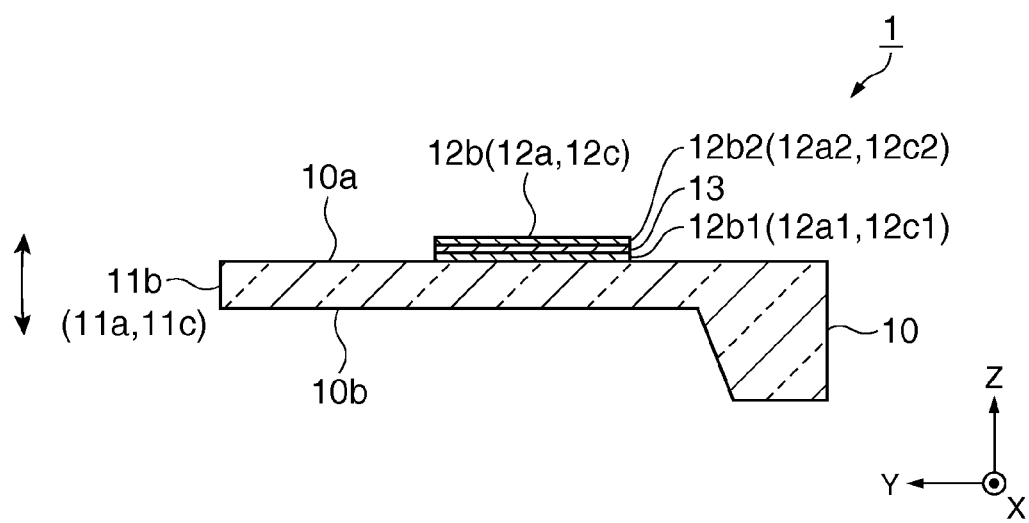

FIGS. 1A and 1B are schematic diagrams showing the schematic configuration of a quartz crystal vibrator element according to a first embodiment, FIG. 1A is a plan view, and FIG. 1B is a cross-sectional view taken along line B-B shown in FIG. 1A. Here, each wiring is not illustrated, and the ratio of the dimensions of the constituent elements is different from that in actual practice.

Figure 2:
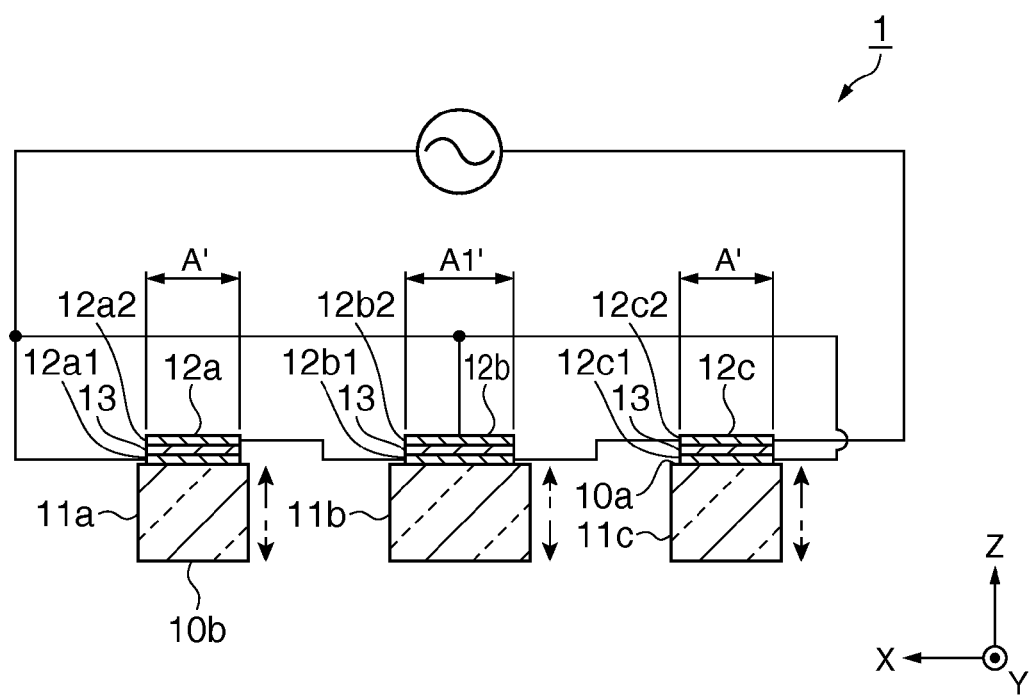
FIG. 2 is a cross-sectional diagram taken along line C-C shown in FIG. 1A and is a wiring diagram of excitation electrodes.

FIG. 2 is a cross-sectional diagram taken along line C-C shown in FIG. 1A and is a wiring diagram of excitation electrodes.

As shown in FIGS. 1A and 1B, the quartz crystal vibrator element 1 includes a base portion 10 and at least three vibrating arms 11a, 11b, and 11c that extend from the base portion 10 in the Y axis direction of the quartz crystal axis as a first direction.

The vibrating arms 11a, 11b, and 11c are formed in a substantially rectangular column shape, are arranged in the X axis direction of the quartz crystal axis as a second direction perpendicular to the Y axis direction in the plan view, and includes excitation electrodes 12a, 12b, and 12c on at least one (here, a principal face 10a) of principal faces 10a and 10b that are specified in the Y axis direction and the X axis direction.

The vibrating arms 11a, 11b, and 11c flexurally vibrate (out-of-plane vibration: vibration in a direction not along the principal face 10a) in the Z-axis direction (the direction of an arrow shown in FIG. 1B) of the quartz crystal axis as a third direction perpendicular to the principal face 10a in accordance with the excitation electrodes 12a, 12b, and 12c.

When the arm width of the vibrating arm 11b as a first vibrating arm located at the center of the arrangement in the X axis direction out of the vibrating arms 11a, 11b, and 11c is W1, the arm width of the vibrating arms 11a and 11c as the second vibrating arms located at both ends of the arrangement in the X axis direction is W, the electrode width of the excitation electrode 12b of the vibrating arm 11b in the X axis direction is A1, and the electrode width of the excitation electrodes 12a and 12c of the vibrating arms 11a and 11c in the X axis direction is A, the quartz crystal vibrator element 1 is configured so as to satisfy the relationship "$1.35 < W1/W < 1.90$" and "$1.35 < A1/A < 1.90$".

In addition, more preferably, the quartz crystal vibrator element 1 is configured so as to satisfy the relationship "$W1/W = 1.60$".

The excitation electrodes 12a, 12b, and 12c has a laminated structure including: first electrodes 12a1, 12b1, and 12c1 disposed on the principal face 10a side; second electrodes 12a2, 12b2, and 12c2 disposed so as to face the first electrodes 12a1, 12b1, and 12c1; and a piezoelectric body 13 that extends between the first electrodes 12a1, 12b1, and 12c1 and the second electrodes 12a2, 12b2, and 12c2.

Here, as shown in FIG. 2, viewed from the Z axis direction, when the width in which the first electrode 12b1 of the excitation electrode 12b of the vibrating arm 11b, the piezoelectric body 13, and the second electrode 12b2 overlap one another in the X axis direction is A1', and the width in which the first electrodes 12a1 and 12c1 of the excitation electrodes 12a and 12c of the vibrating arms 11a and 11c, the piezoelectric body 13, and the second electrodes 12a2 and 12c2 overlap one another in the X axis direction is A', the quartz crystal vibrator element 1 is configured so as to satisfy the relationship "$1.35 < A1'/A' < 1.90$".

As shown in FIGS. 1A, 1B, and 2, in the embodiment, A1=A1' and A=A'.

For the first electrodes 12a1, 12b1, and 12c1 and the second electrodes 12a2, 12b2, and 12c2 of the excitation electrodes 12a, 12b, and 12c, a metal film such as Cr or Au that has relatively high conductivity is used, and, for the piezoelectric body 13, a film formed from a piezoelectric material such as ZnO, AlN, or PZT that has relatively high piezoelectricity is used.

In addition, it is preferable that the excitation electrodes 12a, 12b, and 12c extend from the root portion (a peripheral portion including the boundary from the base portion 10) of the vibrating arms 11a, 11b, and 11c to the tip end portion thereof so as to be disposed to have a length that is about a half of the entire length (a length from the root to the tip end in the Y axis direction) of the vibrating arms 11a, 11b, and 11c.

In addition, as shown in FIG. 1B, the thickness of the base portion 10 in the Z axis direction is formed to be larger than the thickness of the vibrating arms 11a, 11b, and 11c in the Z axis direction.

As denoted by a dashed-two dotted line in FIG. 1A, on the principal face 10b side of both end portions of the base portion 10 in the X axis direction, fixed portions 10c and 10d that are areas fixed to an external member such as a package are disposed. In addition, it is preferable that the fixed portions 10c and 10d are disposed at the end portion of the base portion 10 that is located on a side opposite to the side of the vibrating arms 11a, 11b, and 11c in the Y axis direction.

Here, the operation of the quartz crystal vibrator element 1 will be described.

As shown in FIG. 2, first electrodes 12a1, 12b1, and 12c1 and second electrodes 12a2, 12b2, and 12c2 are connected to an AC power source through crossed wirings, and an AC voltage as a driving voltage is applied to the excitation electrodes 12a, 12b, 12c of the quartz crystal vibrator element 1.

More specifically, the first electrode 12a1 of the vibrating arm 11a, the second electrode 12b2 of the vibrating arm 11b, and the first electrode 12c1 of the vibrating arm 11c are connected together so as to be at the same electric potential, and the second electrode 12a2 of the vibrating arm 11a, the first electrode 12b1 of the vibrating arm 11b, and the second electrode 12c2 of the vibrating arm 11c are connected together so as to be at the same electric potential.

In this state, when an AC voltage is applied between the first electrodes 12a1, 12b1, and 12c1 and the second electrodes 12a2, 12b2, and 12c2, electric fields are generates between the first electrodes 12a1, 12b1, and 12c1 and the second electrodes 12a2, 12b2, and 12c2, and a distortion occurs in the piezoelectric body 13 due to an inverse piezoelectric effect, whereby the piezoelectric body 13 expands or contracts in the Y axis direction.

The quartz crystal vibrator element 1 forms the direction of the electric fields generated in the excitation electrodes 12a and 12c and the direction of the electric field generated in the excitation electrode 12b to be opposite to each other through the crossed wirings, whereby the expansion/contraction of the piezoelectric body 13 is reversed between the vibrating arms 11a and 11c and the vibrating arm 11b.

More specifically, when the piezoelectric bodies 13 of the vibrating arms 11a and 11c expand, the piezoelectric body 13 of the vibrating arm 11b contracts. On the other hand, when the piezoelectric bodies 13 of the vibrating arms 11a and 11c contract, the piezoelectric body 13 of the vibrating arm 11b expands.

In accordance with the expansion/contraction of the piezoelectric body 13, in the quartz crystal vibrator element 1, the vibrating arms 11a, 11b, and 11c bend in a direction of a solid-line arrow when the AC voltage corresponds to one electric potential, and the vibrating arms 11a, 11b, and 11c bend in a direction of a dotted-line arrow when the AC voltage corresponds to the other electric potential.

By repeating this, the vibrating arms 11a, 11b, and 11c of the quartz crystal vibrator element 1 are in flexural vibration (out-of-plane vibration) in the Z axis direction. At this time, the vibrating arms (here, the vibrating arms 11a and 11b or the vibrating arms 11b and 11c) that are adjacent to each other are in flexural vibration in opposite directions (in opposite phases).

As described above, the quartz crystal vibrator element 1 according to this embodiment has a vibration form (out-of-plane vibration mode) in which the vibrating arms 11a, 11b, and 11c are in flexural vibration in the Z axis direction (thickness direction) and, when the arm width of the vibrating arm 11b, which is located at the center of the arrangement, in the X axis direction out of the vibrating arms 11a, 11b, and 11c is W1, the arm width of the vibrating arms 11a and 11c, which are located on both ends, in the X axis direction is W, the electrode width of the excitation electrode 12b of the vibrating arm 11b in the X axis direction is A1, and the electrode width of the excitation electrodes 12a and 12c of the vibrating arms 11a and 11c in the X axis direction is A, is configured such that "1.35<W1/W<1.90" and "1.35<A1/A<1.90".

In addition, when a width in the X axis direction in which the first electrode 12b1 of the vibrating arm 11b, the piezoelectric body 13, and the second electrode 12b2 overlap one another is A1', and a width in the X axis direction in which the first electrodes 12a1 and 12c1 of the vibrating arms 11a and 11c, the piezoelectric body 13, and the second electrodes 12a2 and 12c2 overlap one another is A', the quartz crystal vibrator element 1 is configured such that 1.35<A1'/A'<1.90.

Accordingly, within the above-described range, the quartz crystal vibrator element 1 has a sufficient mechanical balance of the vibration between the vibrating arms 11a, 11b, and 11c according to the expansion/contraction of the piezoelectric bodies 13 of the excitation electrodes 12a, 12b, and 12c in the Z axis direction.

Accordingly, in the quartz crystal vibrator element 1, it is difficult for the vibration energy of the vibrating arms 11a, 11b, and 11c to be delivered to the base portion 10, and the vibration energy leaking to an external member through the base portion 10 decreases so as to suppress a decrease in the Q value, whereby the Q value can be maintained at a predetermined level (in other words, the Q value can be improved more than that of a general configuration).

In addition, the above-described range is set by the inventors or the like based on findings acquired through analysis results of simulations and experiments, and the like.

The above description will be explained further with reference to a graph.

Figure 3A:
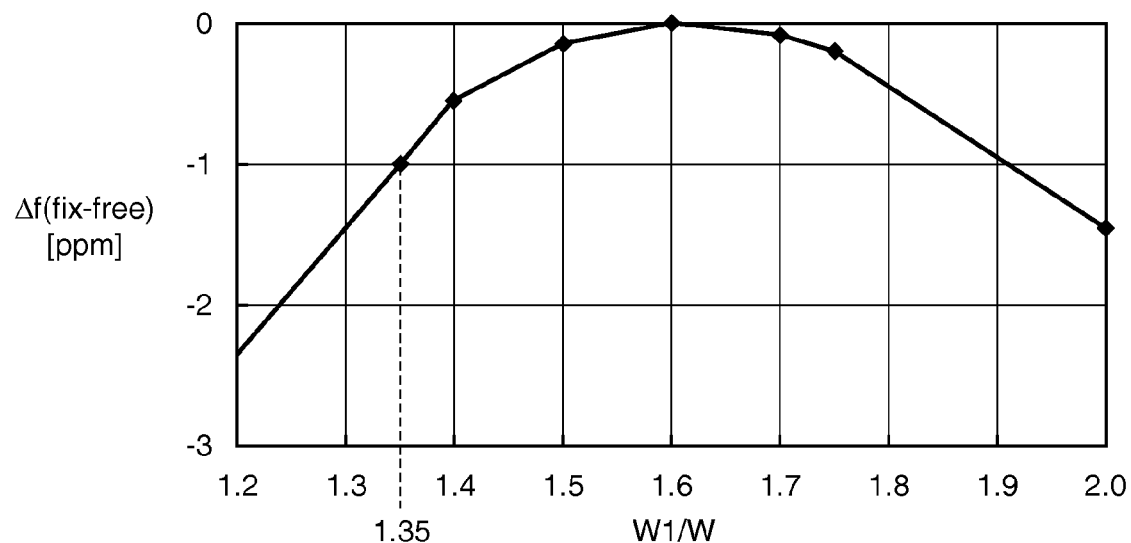
FIGS. 3A and 3B are graphs showing the relationship between the Q value of the quartz crystal vibrator element, the arm width ratio between vibrating arms, and the electrode width ratio between excitation electrodes.
Figure 3B:
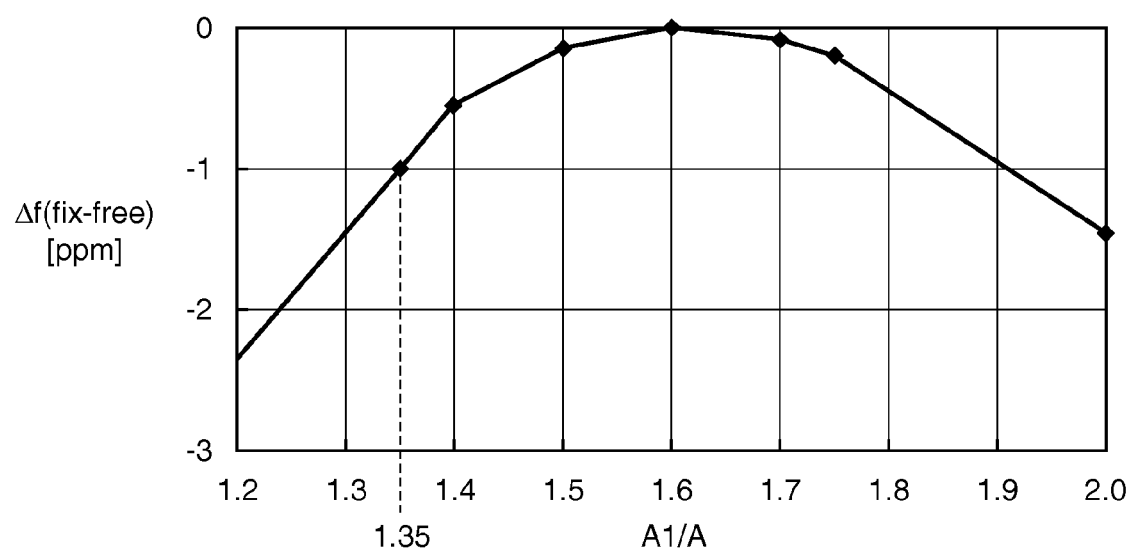

FIGS. 3A and 3B are graphs showing the relationship between the Q value of the quartz crystal vibrator element according to this embodiment, the arm width ratio between vibrating arms, and the electrode width ratio between excitation electrodes.

FIG. 3A is a graph showing the relationship between a frequency change amount Δf relating to the Q value of the quartz crystal vibrator element and "arm width W1 of center vibrating arm/arm width W of vibrating arms located on both ends", and FIG. 3B is a graph showing the relationship between the frequency change amount Δf relating to the Q value of the quartz crystal vibrator element and "electrode width A1 (A1') of the excitation electrode of the center vibrating arm/electrode width A (A') of the excitation electrodes of the vibrating arms located on both ends.

In FIG. 3A, the horizontal axis represents W1/W, and the vertical axis represents the frequency change amount Δf of the quartz crystal vibrator element according to whether the base portion is fixed or not (fixed or free) in ppm.

In FIG. 3B, the horizontal axis represents A1/A (A1'/A'), and the vertical axis represents the frequency change amount Δf of the quartz crystal vibrator element according to whether the base portion is fixed or not (fixed or free) in ppm.

In addition, the less the frequency change amount Δf is, the less a decrease in the Q value is, and it has been proved through the past record that, when the frequency change amount Δf is up to about −1 ppm, a Q value that is sufficient for practical applications can be acquired.

As shown in FIG. 3A, for the range of W1/W that exceeds 1.35 and is less than 1.90, the frequency change amount Δf is within −1 ppm. In addition, for W1/W=1.60, the frequency change amount Δf is the minimum. In other words, the amount of decrease in the Q value is the minimum.

In addition, as shown in FIG. 3B, similarly for the range of A1/A (A1'/A') that exceeds 1.35 and is less than 1.90, the frequency change amount Δf is within −1 ppm.

According to such a result, by configuring the quartz crystal vibrator element 1 according to this embodiment such that 1.35<W1/W<1.90 and 1.35<A1/A (A1'/A')<1.90, the vibration in the Z axis direction between the vibrating arms 11a, 11b, and 11c according to the expansion/contraction of the piezoelectric bodies 13 of the excitation electrodes 12a, 12b, and 12c is sufficiently balanced, and it is difficult for the vibration energy of the vibrating arms 11a, 11b, and 11c to be delivered to the base portion 10, and accordingly, the vibration energy leaking to an external member through the base portion 10 decreases so as to suppress a decrease in the Q value, whereby it can be stated that the Q value is proved to be maintained at a predetermined level.

In addition, by configuring the quartz crystal vibrator element 1 such that W1/W=1.60, the balance in the Z axis direction between the vibration of the vibrating arm 11b and the vibration of the vibrating arms 11a and 11c can be in an optimal state so as to decrease the vibration energy leaking to an external member through the base portion 10 the most, and accordingly, a decrease in the Q value is suppressed the most, whereby it can be stated that the Q value is proved to be maintained at a predetermined level.

In addition, by including the piezoelectric body 13 that extends between both electrodes of the first electrodes 12a1, 12b1, and 12c1 and the second electrodes 12a2, 12b2, and 12c2 disposed so as to face the first electrodes 12a1, 12b1, and 12c1 in the excitation electrodes 12a, 12b, and 12c of the quartz crystal vibrator element 1, the vibrating arms 11a, 11b, and 11c can be vibrated in accordance with the extension/contraction of the excitation electrodes 12a, 12b, and 12c.

Thus, since a piezoelectric material such as a quartz crystal does not need to be necessarily used for the base member of the quartz crystal vibrator element 1, there is a broad range of options for the base member, and accordingly, for example, a semiconductor material such as silicon can be used for the base member.

In addition, since the quartz crystal vibrator element 1 has the thickness of the base portion 10 in the Z axis direction to be larger than the thickness of the vibrating arms 11a, 11b, and 11c in the Z axis direction, a difference between the weight of the base portion 10 and the weight of the vibrating arms 11a, 11b, and 11c increases due to an increase in the weight of the base portion 10.

Accordingly, it is difficult for the vibration energy of the vibrating arms 11a, 11b, and 11c to be delivered to the base portion 10 in the quartz crystal vibrator element 1. Therefore, the vibration energy leaking to an external member through the base portion 10 decreases further so as to further suppress a decrease in the Q value, whereby the Q value can be maintained at a predetermined level.

Furthermore, since the fixed portions 11c and 10d are disposed in both end portions of the base portion 10 of the quartz crystal quartz vibrator element 1 in the X axis direction, paths from the vibrating arms 11a, 11b, and 11c to the fixed portions 10c and 10d of the base portion 10 can be formed to be relatively long, compared to a case where the fixed portions 10c and 10d are disposed in other portions.

As a result, the vibration energy leaking to an external member through the fixed portions 10c and 10d in the quartz crystal vibrator element 1 when the fixed portions 10c and 10d of the base portion 10 are fixed to the external member is less than that in a case where the fixed portions 10c and 10d are disposed in any other portion (for example, a case where the fixed portions 10c and 10d are disposed near the vibrating arms 11a, 11b, and 11c), the decrease in the Q value is suppressed further, whereby the Q value can be maintained at a predetermined level.

Second Embodiment

Next, a quartz crystal vibrator as a vibrator that includes the quartz crystal vibrator element (vibrator element) described in the first embodiment will be described.

Figure 4A:
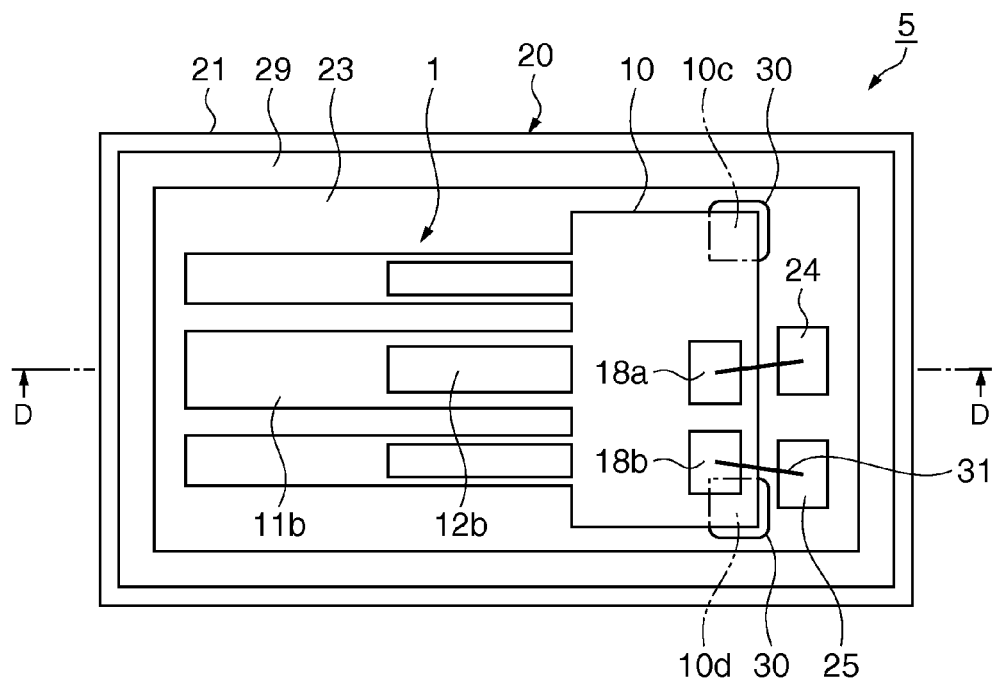
FIGS. 4A and 4B are schematic diagrams showing the schematic configuration of a quartz crystal vibrator according to a second embodiment.
Figure 4B:
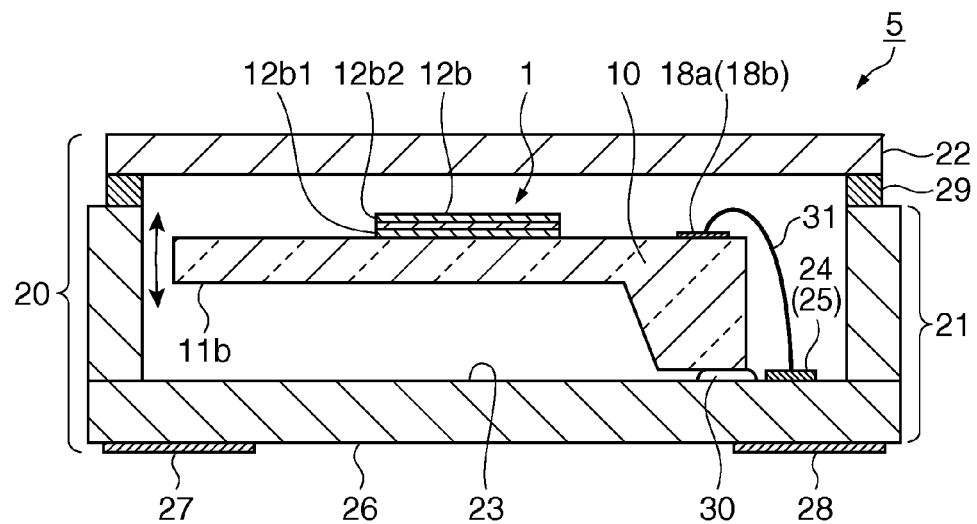

FIGS. 4A and 4B are schematic diagrams showing the schematic configuration of the quartz crystal vibrator according to a second embodiment. FIG. 4A is a plan view viewed above the lid (lid body) side, and FIG. 4B is a cross-sectional view taken along line D-D shown in FIG. 4A. In the plan view, the lid is not illustrated. In addition, wirings are not illustrated in the figures.

The same reference numeral is assigned to the same portion as that of the first embodiment, and portions different from those of the first embodiment will be focused in the description.

As shown in FIGS. 4A and 4B, the quartz crystal vibrator 5 includes the quartz crystal vibrator element 1 described in the first embodiment and a package 20 housing the quartz crystal vibrator element 1.

The package 20 includes a package base 21 that has an approximately rectangular planar shape and includes a concave portion and a lid 22 that covers the concave portion of the package base 21 and includes an approximately rectangular planar shape and is formed in an approximate rectangular parallelepiped shape.

For the package base 21, an aluminum oxide-based sintered compact acquired by molding, laminating, and sintering a ceramic green sheet, a quartz crystal, glass, silicon, or the like is used.

For the lid 22, the same material as that of the package base 21 or metal such as Kovar, 42 alloy, or stainless steel is used.

In the package base 21, internal terminals 24 and 25 are disposed on the inner bottom face (a bottom face located on the inner side of the concave portion) 23.

The internal terminals 24 and 25 are formed in an approximate rectangular shape at positions near connection electrodes 18a and 18b disposed in the base portion 10 of the quartz crystal vibrator element 1. The connection electrodes 18a and 18b are connected to the first electrode (12b1 or the like) and the second electrode (12b2 or the like) of each excitation electrode (12b or the like) of the quartz crystal vibrator element 1 through wirings not illustrated in the figure.

For example, in the wirings shown in FIG. 2, one wiring of the AC power source is connected to the connection electrode 18a, and the other wiring thereof is connected to the connection electrode 18b.

On the outer bottom face (a face opposite to the inner bottom face 23; the bottom face located on the outer side) 26 of the package base 21, one pair of external terminals 27 and 28 used for mounting an external member such as an electronic device are formed.

The external terminals 27 and 28 are connected to the internal terminals 24 and 25 through internal wirings not shown in the figure. For example, the external terminal 27 is connected to the internal terminal 24, and the external terminal 28 is connected to the internal terminal 25.

The internal terminals 24 and 25 and the external terminals 27 and 28 are formed from metal films acquired by laminating a coating film formed from a material such as Ni or Au on a metallized layer formed from a material such as W (tungsten) by using a plating method or the like.

In the quartz crystal vibrator 5, the fixed portions 10c and 10d of the base portion 10 of the quartz crystal vibrator element 1 are fixed to the inner bottom face 23 of the package base 21 through an epoxy-based, silicon based, or polyimide-based adhesive 30.

In addition, in the quartz crystal vibrator 5, the connection electrodes 18a and 18b of the quartz crystal vibrator element 1 are connected to the internal terminals 24 and 25 through metal wires 31 formed from materials such as Au and Al.

In a state in which the quartz crystal vibrator element 1 of the quartz crystal vibrator 5 is connected to the internal terminals 24 and 25 of the package base 21, the concave portion of the package base 21 is covered with the lid 22, and the package base 21 and the lid 22 are bonded together by using a bonding member 29 such as a seam ring, a low melting point glass, an adhesive, or the like, whereby the inside of the package 20 is sealed in an airtight manner.

In addition, the inside of the package 20 is in a decompressed state (a state having a high degree of vacuum) or a state in which inert gas such as nitrogen, helium, or argon is filled therein.

In addition, the package may be configured by a planar-shape package base and a lid including a concave portion, and the like. Furthermore, the package may include concave portions on both the package base and the lid.

Furthermore, instead of the fixed portions 10c and 10d, the base portion 10 of the quartz crystal vibrator element 1 may be fixed to a portion other than the fixed portions 10c and 10d, for example, at one position of a portion that includes the center of a straight line joining the fixed portion 10c and the fixed portion 10d.

In such a case, by fixing the quartz crystal vibrator element 1 at one position, the distortion of the base portion 10 due to thermal stress occurring in the fixed portion can be suppressed.

In the quartz crystal vibrator 5, each vibrating arm (11b and the like) of the quartz crystal vibrator element 1 oscillates (resonates) at a predetermined frequency (for example, about 32 kHz) in the thickness direction (a direction of an arrow shown in FIG. 4B) in accordance with a driving signal (AC voltage) applied to the excitation electrode (12b or the like) through the external terminals 27 and 28, the internal terminals 24 and 25, the metal wire 31, and the connection electrodes 18a and 18b.

As described above, since the quartz crystal vibrator 5 according to the second embodiment includes the quartz crystal vibrator element 1, the vibrator (for example, a vibrator that can maintain the Q value to a predetermined level by suppressing a decrease in the Q value) having the advantages described in the first embodiment can be provided.

Third Embodiment

Next, a quartz crystal oscillator as an oscillator including the quartz crystal vibrator element (vibrator element) described in the first embodiment will be described.

Figure 5A:
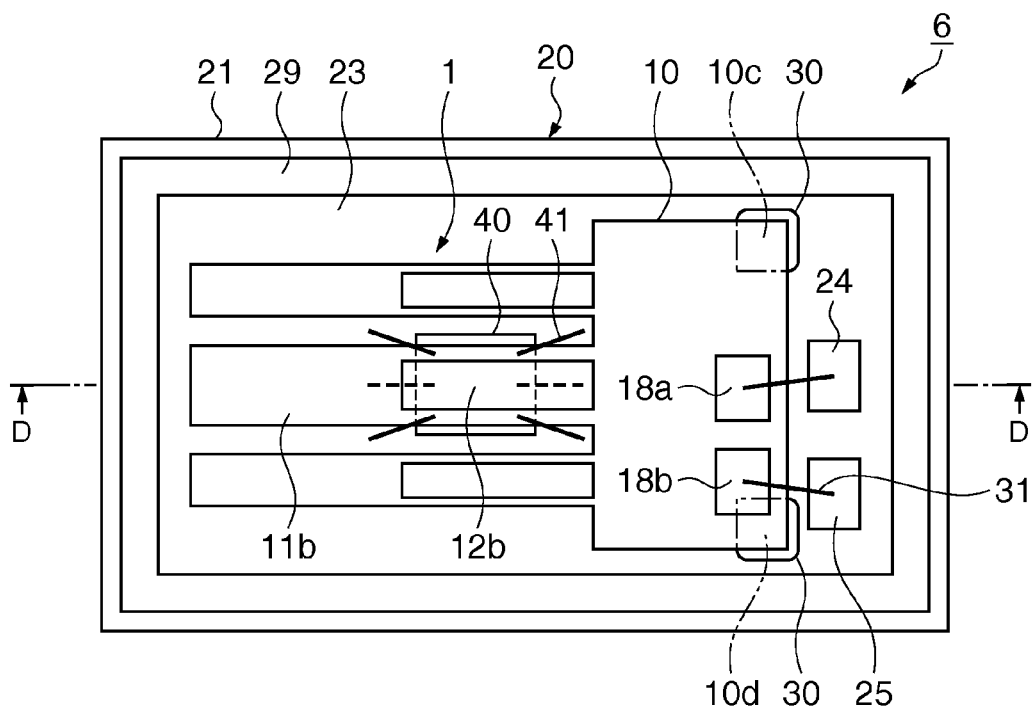
FIGS. 5A and 5B are schematic diagrams showing the schematic configuration of a quartz crystal oscillator according to a third embodiment.
Figure 5B:
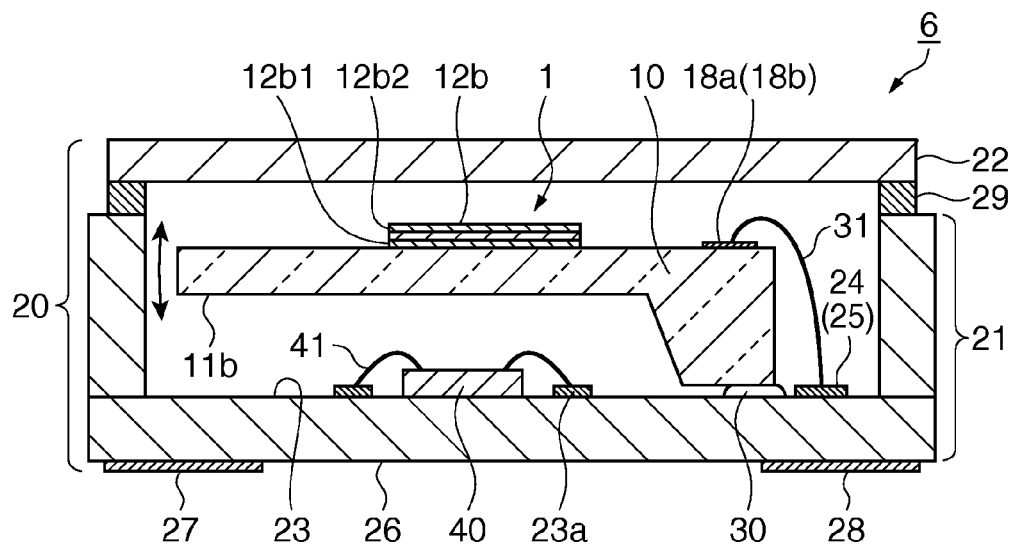

FIGS. 5A and 5B are schematic diagrams showing the schematic configuration of the quartz crystal oscillator according to a third embodiment. FIG. 5A is a plan view viewed above the lid side, and FIG. 5B is a cross-sectional view taken along line D-D shown in FIG. 5A. In the plan view, the lid and some constituent elements are not illustrated. In addition, wirings are not illustrated in the figures.

The same reference numeral is assigned to the same portion as that of the first embodiment or the second embodiment, detailed description thereof will not be presented, and portions different from those of the first and second embodiments will be focused in the description.

As shown in FIGS. 5A and 5B, the quartz crystal oscillator 6 includes: the quartz crystal vibrator element 1 described in the first embodiment; an IC chip 40 as an oscillation circuit that oscillates the quartz crystal vibrator element 1; and a package 20 that houses the quartz crystal vibrator element 1 and the IC chip 40.

An internal connection terminal 23a is disposed on an intermediate bottom face 23 of a package base 21.

The IC chip 40 having the oscillation circuit built therein is fixed to the intermediate bottom face 23 of the package base 21 by using an adhesive or the like not shown in the figure.

A connection pad, which is not shown in the figure, of the IC chip 40 is connected to an internal connection terminal 23a through a metal wire 41 formed from a material such as Au or Al.

The internal connection terminal 23a is formed from a metal film acquired by laminating a coating film formed from a material such as Ni or Au on a metallized layer formed from a material such as W (tungsten) by using a plating method or the like and is connected to external terminals 27 and 28 and internal terminals 24 and 25 of the package 20 through internal wirings not shown in the figure.

For the connection between the connection pad of the IC chip 40 and the internal connection terminal 23a, in addition to a connection method through wire bonding using a metal wire 41, a connection method through mounting a flip chip that is acquired by inverting the IC chip 40 or the like may be used.

In the quartz crystal oscillator 6, each vibrating arm (11b and the like) of the quartz crystal vibrator element 1 oscillates (resonates) at a predetermined frequency (for example, about 32 kHz) in accordance with a driving signal applied to the excitation electrode (12b or the like) from the IC chip 40 through the internal connection terminal 23a, the internal terminals 24 and 25, the metal wire 31, and the connection electrodes 18a and 18b.

Then, the quartz crystal oscillator 6 outputs an oscillation signal generated in accordance with the oscillation to the outside thereof through the IC chip 40, the internal connection terminal 23a, the external terminals 27 and 28, and the like.

As described above, since the quartz crystal oscillator 6 according to the third embodiment includes the quartz crystal vibrator element 1, the oscillator (for example, an oscillator that can maintain the Q value to a predetermined level by suppressing a decrease in the Q value) having the advantages described in the first embodiment can be provided.

In addition, the quartz crystal oscillator 6 may not have the configuration in which the IC chip 40 is built in the package 20 but have an externally-attached configuration having a module structure (for example, the quartz crystal vibrator and the IC chip are mounted on one substrate).

Fourth Embodiment

Next, a cellular phone as an electronic device including the quartz crystal vibrator element (vibrator element) described in the first embodiment will be described.

Figure 6:
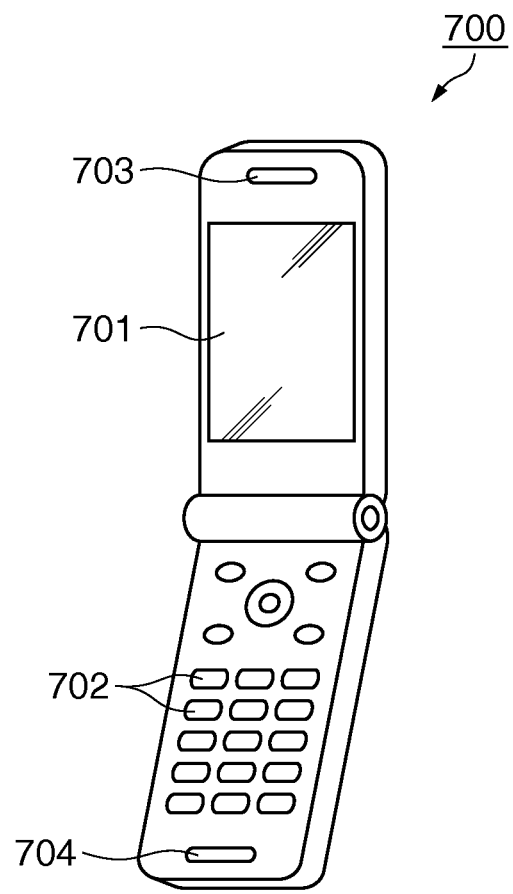
FIG. 6 is a schematic perspective view showing a cellular phone according to a fourth embodiment.

FIG. 6 is a schematic perspective view showing a cellular phone according to a fourth embodiment.

The cellular phone 700 shown in FIG. 6 is configured so as to include the quartz crystal vibrator element 1 described in the first embodiment as a reference clock oscillating source or the like and to further include a liquid crystal display device 701, a plurality of operational buttons 702, an ear piece 703, and a mouth piece 704.

The above-described quartz crystal vibrator element 1 is not limited to be used to the cellular phone and may be appropriately used as a reference clock oscillating source of an electronic book, a personal computer, a television set, a digital still camera, a video camera, a video recorder, a navigation device, a pager, an electronic organizer, a calculator, a word processor, a workstation, a television telephone, a POS terminal, or a device including a touch penal. In any case, an electronic device having the advantages described in the above-described embodiments can be provided.

In addition, as the quartz crystal as the base member of the vibrator element, for example, a Z-cut substrate, an X-cut substrate, or the like that is acquired by cutting a raw quartz crystal stone or the like at a predetermined angle can be used. In addition, in a case where the Z cut substrate is used, an etching processing can be performed in an easy manner based on the characteristics thereof, and temperature-frequency characteristics are excellent based on the characteristics in a case where the X cut substrate is used.

Furthermore, the material of the base member of the vibrator element is not limited to the quartz crystal, and may be a piezoelectric material such as lithium tantalate ($LiTaO_3$), lithium tetraborate ($Li_2B_4O_7$), lithium niobate ($LiNbO_3$), lead zirconium titanate (PZT), zinc oxide (ZnO) or aluminum nitride (AlN) or a semiconductor material such as silicon.

In addition, the number of the vibrating arms of the vibrator element is not limited to three and may be an odd number equal to or greater than five such as five, seven, or nine.

Furthermore, the thickness of the base portion of the vibrator element may be the same as that of the vibrating arm. In such a case, the vibrator element has a planar plate shape, whereby the manufacturing thereof can be performed in an easy manner.

The entire disclosure of Japanese Patent Application No. 2011-020414, filed on Feb. 2, 2011 is expressly incorporated by reference herein.

What is claimed is:

1. A vibrator element comprising:
    a base portion; and
    at least three vibrating arms that extend from the base portion in a first direction,
    wherein the vibrating arms are arranged in a second direction perpendicular to the first direction, and each one of the vibrating arms includes an excitation electrode at least on one principal face extending along a plane that is specified by the first direction and the second direction,
    wherein each one of the vibrating arms is vibrated by the excitation electrode in a third direction perpendicular to the principal face, and
    wherein, when the vibrating arm located at the center of the arrangement out of the vibrating arms is set as a first vibrating arm, and each one of the vibrating arms located on both ends of the arrangement is set as a second vibrating arm, the first vibrating arm and the second vibrating arm vibrate in opposite directions, and, when an arm width of the first vibrating arm in the second direction is W1, an arm width of the second vibrating arm in the second direction is W, an electrode width of the excitation electrode of the first vibrating arm in the second direction is A1, and an electrode width of the excitation electrode of the second vibrating arm in the second direction is A, $1.35<W1/W<1.90$ and $1.35<A1/A<1.90$.

2. The vibrator element according to claim 1,
    wherein the excitation electrode includes:
    a first electrode that is disposed on the principal face side;
    a second electrode that is disposed above the first electrode; and
    a piezoelectric body that extends between the first electrode and the second electrode.

3. The vibrator element according to claim 2, wherein, when, viewed from the third direction, a width in which the first electrode, the second electrode, and the piezoelectric body of the first vibrating arm overlap one another is A1', and a width in which the first electrode, the second electrode, and the piezoelectric body of the second vibrating arm overlap one another is A', $1.35<A1'/A'<1.90$.

4. The vibrator element according to claim 1, wherein a thickness of the base portion in the third direction is larger than a thickness of each one of the vibrating arms in the third direction.

5. The vibrator element according to claim 1, wherein fixed portions are disposed in both end portions of the base portion in the second direction.

6. The vibrator element according to claim 1, wherein a ratio W1/W of the arm width W1 to the arm width W is 1.60.

7. A vibrator comprising:
    the vibrator element according to claim 1; and
    a package that houses the vibrator element.

8. A vibrator comprising:
    the vibrator element according to claim 2; and
    a package that houses the vibrator element.

9. A vibrator comprising:
    the vibrator element according to claim 3; and
    a package that houses the vibrator element.

10. A vibrator comprising:
    the vibrator element according to claim 4; and
    a package that houses the vibrator element.

11. An oscillator comprising:
    the vibrator element according to claim 1; and
    an oscillation circuit that oscillates the vibrator element.

12. An oscillator comprising:
    the vibrator element according to claim 2; and
    an oscillation circuit that oscillates the vibrator element.

13. An oscillator comprising:
    the vibrator element according to claim 3; and
    an oscillation circuit that oscillates the vibrator element.

14. An oscillator comprising:
    the vibrator element according to claim 4; and
    an oscillation circuit that oscillates the vibrator element.

15. An electronic device comprising: the vibrator element according to claim 1.

16. An electronic device comprising: the vibrator element according to claim 2.

17. An electronic device comprising: the vibrator element according to claim 3.

18. An electronic device comprising: the vibrator element according to claim 4.

* * * * *